United States Patent
Hattori et al.

[11] Patent Number: 5,955,237
[45] Date of Patent: Sep. 21, 1999

[54] PHOTOSENSITIVE RECORDING MEDIUM EXPOSED BY THREE EXPOSURE WAVELENGTHS LONGER THAN 500 NM

[75] Inventors: Yasuhiro Hattori; Takemi Yamamoto, both of Nagoya, Japan

[73] Assignee: Brother Kogyo Kabushiki Kaisha, Nagoya, Japan

[21] Appl. No.: 08/827,731

[22] Filed: Apr. 8, 1997

[30] Foreign Application Priority Data

Apr. 9, 1996 [JP] Japan .................................. 8-086284

[51] Int. Cl.$^6$ ...................................................... G03C 1/73
[52] U.S. Cl. .................. 430/138; 430/273.1; 430/281.1; 430/342; 430/343; 430/344; 430/926
[58] Field of Search ............................... 430/138, 281.1, 430/285.1, 273.1, 333, 340, 342, 343, 344, 952, 955–960

[56] References Cited

U.S. PATENT DOCUMENTS

| | | | |
|---|---|---|---|
| 2,800,457 | 7/1957 | Green et al. | 428/402.2 |
| 2,800,458 | 7/1957 | Green | 428/402.2 |
| 4,001,140 | 1/1977 | Foris et al. | 252/316 |
| 4,087,376 | 5/1978 | Foris et al. | 252/316 |
| 4,089,802 | 5/1978 | Foris et al. | 252/316 |
| 4,772,541 | 9/1988 | Gottschalk et al. | 430/339 |
| 4,842,980 | 6/1989 | Gottschalk et al. | 430/138 |
| 4,865,942 | 9/1989 | Gottschalk et al. | 430/138 |
| 4,904,561 | 2/1990 | Yamamoto | 430/138 |
| 4,937,159 | 6/1990 | Gottschalk et al. | 430/138 |
| 4,977,511 | 12/1990 | Gottschalk et al. | 364/473 |
| 4,981,834 | 1/1991 | Sakojiri et al. | 503/204 |
| 5,035,621 | 7/1991 | Gottschalk et al. | 433/226 |
| 5,151,520 | 9/1992 | Gottschalk et al. | 548/110 |
| 5,279,912 | 1/1994 | Telfer et al. | 430/17 |
| 5,510,224 | 4/1996 | Takahashi et al. | 430/138 |

FOREIGN PATENT DOCUMENTS

| | | |
|---|---|---|
| A 36-9168 | 6/1936 | Japan . |
| A 38-19574 | 9/1938 | Japan . |
| A 42-446 | 1/1942 | Japan . |
| A 42-771 | 1/1942 | Japan . |
| A 51-9079 | 1/1976 | Japan .............................. B01J 13/02 |
| A-62-143044 | 6/1987 | Japan .............................. G03C 1/68 |
| A 952807 | 3/1964 | United Kingdom . |
| A 965074 | 7/1964 | United Kingdom . |

*Primary Examiner*—Bernard Codd
*Attorney, Agent, or Firm*—Oliff & Berridge, PLC

[57] ABSTRACT

A photosensitive recording medium comprising a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3. All the wavelengths L1, L2 and L3 are wavelengths longer than 500 nm.

30 Claims, 2 Drawing Sheets

PHOTOSENSITIVE RECORDING MEDIUM EXPOSED BY THREE EXPOSURE WAVELENGTHS LONGER THAN 500 NM

BACKGROUND OF THE INVENTION

1. Field of the Invention

This invention relates to a photosensitive recording medium, and more particularly to a photosensitive recording medium on which image information is recorded by the action of light to form a color image.

2. Description of the Related Art

Photosensitive recording mediums are conventionally available which comprise a base material and held thereon photosensitive microcapsules comprised of a shell formed of a resin and, enclosed in the shell, a photosensitive material that undergoes polymerization upon exposure to light with a specific wavelength to harden or thicken (become viscous) and an image-forming agent.

Japanese Patent Application Laid-open No. 62-143044 also discloses a photosensitive recording medium comprising a base material and held thereon A) yellow color-forming microcapsules enclosing a yellow image-forming agent and a photosensitive material having a maximum hardening sensitivity to blue, which is complementary to yellow, i.e., having sensitivity to light of about 450 nm, B) magenta color-forming microcapsules enclosing a magenta image-forming agent and a photosensitive material having a maximum hardening sensitivity to green, which is complementary to magenta, i.e., having sensitivity to light of about 550 nm, and C) cyan color-forming microcapsules enclosing a cyan image-forming agent and a photosensitive material having a maximum hardening sensitivity to red, which is complementary to cyan, i.e., having sensitivity to light of about 650 nm.

Here, the image-forming agent is, specifically stated, a dye precursor. This dye precursor reacts with a color developer to form a color. In addition to those employing such a dye precursor, the present applicant has filed various patent applications relating to a photosensitive recording medium in which a dye or pigment which is colored in itself is used as the image-forming agent to make the color developer unnecessary.

The present applicant has also filed many patent applications relating to an image-forming apparatus such as a color copying machine of the type wherein, using such a photosensitive recording medium, the photosensitive recording medium is exposed to light transmitted through or reflected from a color original and thereafter an image-receiving sheet and the photosensitive recording medium are put together and pressed so that image-forming agents of microcapsules having not hardened are transferred to the image-receiving sheet to thereby form a full-color image on the image-receiving sheet.

In the above image-forming apparatus, a white-light source such as a halogen lamp is used, where the color original is irradiated with white light of the light source, and the photosensitive recording medium is exposed to the light transmitted therethrough or reflected therefrom, followed by pressing to effect development. Here, the light reflected from, e.g., red portions of the color original has a wavelength of 650 nm as a central wavelength, and hence the cyan color-forming microcapsules harden (to be more exact, photosensitive materials contained in the cyan color-forming microcapsules harden) but the yellow color-forming microcapsules and magenta color-forming microcapsules do not. Then, the image-receiving sheet and the photosensitive recording medium are put together and pressed, whereupon the cyan color-forming microcapsules having already hardened are not collapsed but the yellow color-forming microcapsules and magenta color-forming microcapsules having not hardened are collapsed, so that red color, which is a mixed color of yellow and magenta, is formed on the image-receiving sheet.

That is, in such a color copying machine, each color of the image-forming agent in the microcapsules stands complementary to the light giving a maximum value of photosensitivity of each photosensitive material. Color printers are also proposed in which the photosensitive recording medium is successively exposed to image information light having wavelengths of red, green and blue, using display devices that display images.

In this instance, the display devices include what is called Cathod Ray Tubes (CRT's), liquid-crystal display devices, fluorescent display tubes and light-emitting diodes (LEDs).

These display devices have their own characteristic features. The CRTs have a high emission luminance and are suited for exposure, but have the disadvantage that the apparatus must be made large in size. The liquid-crystal display devices are suited for making the apparatus small-sized, but have the disadvantage that they have no sufficiently high efficiency of light transmission and hence require long-time exposure because of an insufficient brightness in exposure.

Meanwhile, the LEDs and the fluorescent display tubes are self-emission type devices, and hence have a high emission luminance and also can make the apparatus smaller than the CRTs. Thus, they are considered preferable as exposure light sources.

Accordingly, such self-emission type light sources (e.g., LEDs) are usually used when photosensitive recording mediums are not exposed using the white light made incident on images of an original but exposed in accordance with image data (digital data) representing respective images of, e.g., a full color image separated into a red image, a green image and a blue image.

There is an important problem also when photosensitive recording mediums are exposed by means of such self-emission type display devices. That is, these display devices can not always emit exact light of red, green and blue, i.e., the light with wavelengths of 650 nm, 550 nm and 450 nm in order, and wavelengths around these. For example, in the case of LEDs, light-emitting devices of red, orange, yellow and green have been widely put into practical use and are available at moderate prices. However, devices that emit blue light with wavelength of about 450 nm have just began to be put into manufacture, and are of course so expensive that they are actually not feasible for practical use.

The fluorescent display tubes also have a similar problem. Although there are fluorescent materials that emit blue light with wavelength of about 450 nm, they have a much poorer emission efficiency for that color than other bluish green (about 505 nm) or green (about 520 nm), and hence they can not be used as exposure light sources.

Thus, it has been difficult to make up inexpensive printers by the use of conventional photosensitive recording mediums.

SUMMARY OF THE INVENTION

The present invention was made in order to solve the above problems. Accordingly, an object of the present invention is to provide a novel photosensitive recording medium that enables formation of full-color images through exposure using a readily available, inexpensive exposure light source.

The present inventors have taken note of the following facts: A) as image-recording mediums used in apparatus of the type wherein a photosensitive recording medium is exposed using a display device or a light-emitting device in accordance with image information, i.e., as those used in color printers, it is unnecessary for the color of the image-forming agent in microcapsules to stand complementary to the light giving a maximum value of photosensitivity for each photosensitive material, and B) among the display devices or light-emitting devices, those of a self-emission type or having a high emission luminance, stated specifically, light-emitting devices and fluorescent display tubes, have an insufficient emission luminance on the shorter wavelength side than about 500 nm. Thus, they have accomplished the present invention.

The present invention provides a photosensitive recording medium comprising a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3; all the wavelengths L1, L2 and L3 being wavelengths longer than 500 nm.

This and other objects, features and advantages of the present invention are described in or will become apparent from the following detailed description of the invention.

DETAILED DESCRIPTION OF THE INVENTION

Figure 1:
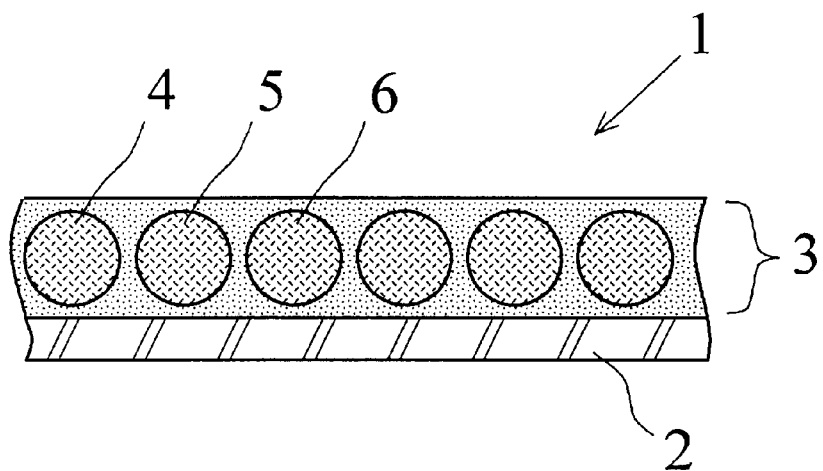
FIG. 1 is a cross section diagrammatically showing a photosensitive recording medium according to a first embodiment of the present invention.

The photosensitive recording medium of the present invention comprises, as summarized above, a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3, and all the wavelengths L1, L2 and L3 are wavelengths longer than 500 nm. The lights with wavelengths L1, L2 and L3 to which yellow, magenta and cyan color-forming particles have maximum hardening sensitivities are preferably image information lights, that are emitted from various display devices, preferably fluorescent display tubes or light-emitting diodes (LED).

The photosensitive recording medium in which all the wavelengths L1, L2 and L3 are wavelengths longer than 500 nm as described above, e.g., a photosensitive recording medium in which the wavelength L1 is 565 nm, the wavelength L2 is 630 nm and the wavelength L3 is 700 nm, can be exposed using a green light-emitting LED, an orange light-emitting LED and a red light-emitting LED which are available at moderate prices as having been put into practical use.

With respect to the correlation among the wavelengths L1, L2 and L3, these L1, L2 and L3 have to be different from one another, and they may preferably are apart from one another in such an extent that no crosstalk occur. The order of L1, L2 and L3 in a wavelength includes cases represented by the following expressions (1) to (6).

$$L1<L2<L3 \tag{1}$$

$$L1<L3<L2 \tag{2}$$

$$L2<L1<L3 \tag{3}$$

$$L2<L3<L1 \tag{4}$$

$$L3<L1<L2 \tag{5}$$

$$L3<L2<L1 \tag{6}$$

Of these, the order of L1, L2 and L3 may preferably satisfy the expression (1).

The photosensitive components used in such a photosensitive recording medium are each constituted of a polymerizable material, a polymerization initiator and optionally a wavelength sensitizer. In order to achieve the photosensitive recording medium of the present invention, the mixing proportion of the polymerization initiator or the wavelength sensitizer or both the polymerization initiator and the wavelength sensitizer may be controlled.

If there is any overlapping region (crosstalk) between medium sensitivity characteristics and low sensitivity characteristics in the sensitivity characteristics at which the three kinds of photosensitive components are photosensitive to harden, the exposure may take place at the overlapping portion, depending on the emission wavelength characteristics of the light sources used (e.g., LEDs), so that some of microcapsules that should not be photosensitive to that light and should not harden may harden to form images having a poor chroma. In such an instance, a filter may be used so that the light of the light sources can be controlled so as not to have the wavelength at which the exposure may take place at the overlapping portion. Namely, a filter that transmits only portions free of the overlapping region may be used.

The respective color-forming particles may preferably be in the form of microcapsules comprised of a shell formed of a resin and, contained inside the shell, the corresponding photosensitive component and image-forming agent. In such a photosensitive recording medium, the shell formed of a resin restrains the photosensitive component in the shell and the oxygen in the atmosphere from mixing. This makes the photosensitive component efficiently undergo photopolymerization, and hence images can be recorded by exposure using a smaller energy.

As the image-forming agent, it is preferable to use a colorless dye precursor capable of forming a color upon reaction with a color developer. In such an instance, the color developer may be coated on an image-receiving sheet, or preferably the color developer may be contained in the photosensitive layer. When constituted in this way, the photosensitive recording medium before exposure has a colorless photosensitive layer, and color images are directly formed in the photosensitive layer upon exposure followed by pressure development. Hence, what is consumed for the formation of images is only the photosensitive recording medium, and only one sort of supplies may be used, compared with those in which a color developer is coated on an image-receiving sheet and the photosensitive surface of the photosensitive recording medium and the developer-coated surface of the image-receiving sheet are put into face-to-face contact, followed by pressure development to form full-color images on the image-receiving sheet, and those in which copying sheets and toner are consumed as in the case of electrophotographic copying machines. Thus, the image-forming apparatus can be made to have a very simple constitution and also can be made small-sized and more inexpensive.

A transparent layer may be further formed so as to cover the photosensitive layer. This is preferable because the color images formed can be protected and also the color images can be prevented from damaging or fading.

The photosensitive recording medium of the present invention will be described below in greater detail with reference to the accompanying drawings.

FIG. 1 is a cross section diagrammatically showing a photosensitive recording medium according to a first embodiment of the present invention.

A photosensitive recording medium 1 comprises a base material 2 formed of a film of polyester or the like and coated on its surface a photosensitive layer 3 that is photosensitive to visible light to harden.

Stated more specifically, the photosensitive layer 3 is formed by mixture of three different microcapsules comprised of yellow color-forming photosensitive microcapsules (hereinafter "Y-capsules") 4, magenta color-forming photosensitive microcapsules (hereinafter "M-capsules") 5 and cyan color-forming photosensitive microcapsules (hereinafter "C-capsules") 6, and a binder resin.

These photosensitive microcapsules 4, 5 and 6 will be described below in detail.

The Y-capsules 4 comprise a shell formed of resin, and enclosed in the shell the first photosensitive component having a maximum hardening sensitivity to light with wavelength L1 and its vicinity and a yellow image-forming agent. The M-capsules 5 comprise a shell formed of resin, and enclosed in the shell the second photosensitive component having a maximum hardening sensitivity to light with wavelength L2 and its vicinity and a magenta image-forming agent. The C-capsules 6 comprise a shell formed of resin, and enclosed in the shell the third photosensitive component having a maximum hardening sensitivity to light with wavelength L3 and its vicinity and a cyan image-forming agent.

Figure 2:
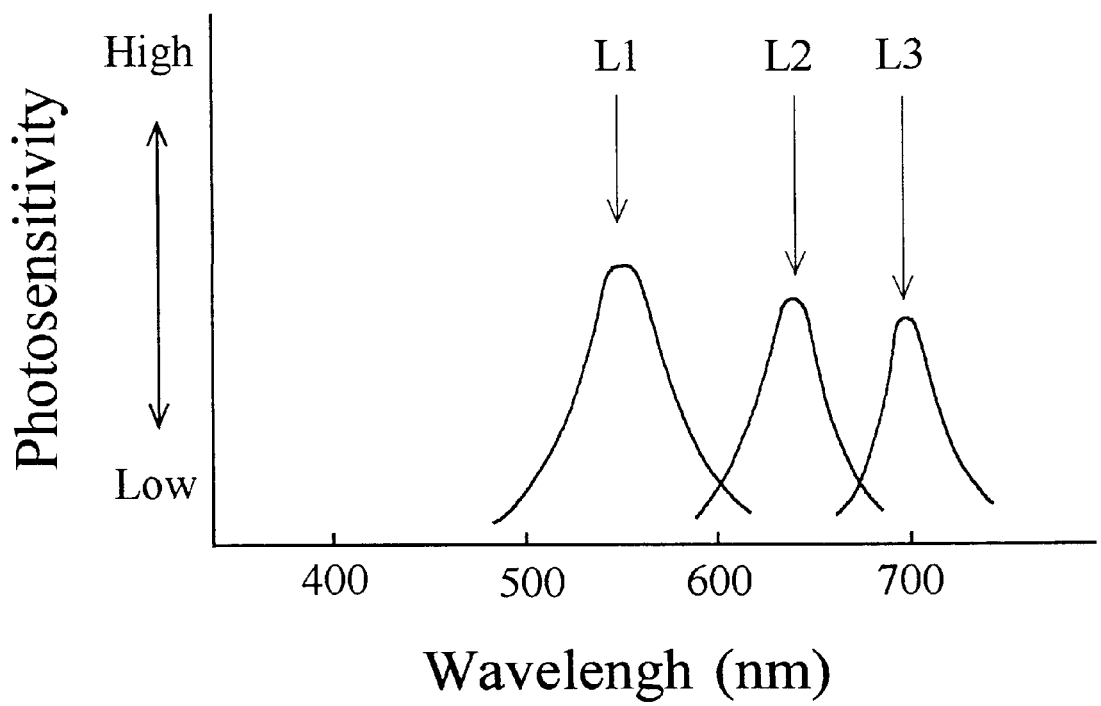
FIG. 2 is a graph showing photosensitive wavelength characteristics of photosensitive components enclosed in microcapsules of the photosensitive recording medium.

The wavelength characteristics of the light to which the photosensitive recording medium 1 has a hardening sensitivity will be described with reference to FIG. 2. As shown in FIG. 2, the hardening photosensitivity of the Y-capsules 4 contained in the photosensitive recording medium 1 takes a maximum value with respect to the wavelength L1 and is distributed to wavelengths in its vicinity. Similarly, the hardening photosensitivity of the M-capsules 5 takes a maximum value with respect to the wavelength L2 and is distributed to wavelengths in its vicinity. Similarly, the hardening photosensitivity of the C-capsules 6 takes a maximum value with respect to the wavelength L3 and is distributed to wavelengths in its vicinity.

The values of the wavelengths L1, L2 and L3 are, stated specifically, 565 nm for L1, 630 nm for L2 and 700 nm for L3. These wavelengths correspond to the central wavelengths of light emitted from green, orange and red LEDs, respectively.

The respective photosensitive components each comprise a polymerizable material, a photopolymerization initiator and a wavelength sensitizer.

The photopolymerization initiator is used to generate reactive species (radicals) upon absorption of light, where the polymerizable material undergoes polymerization by the action of the radicals to harden. The wavelength sensitizer is used in combination with the photopolymerization initiator to thereby control the wavelengths at which the photopolymerization initiator is photosensitive, and governs the wavelengths L1, L2 and L3 that give the maximum hardening sensitivities referred to in the present invention.

The wavelength sensitizer contained in the first photosensitive component of the Y-capsules 4 may preferably be a dye having a maximum absorption wavelength at about 565 nm, specifically including 1-ethyl-2-[(1-ethyl-4(1H)-quinolinylidene)methyl]quinolinium iodide, and 2-[[2-[2-[4-(dimethylamino)phenyl]ethynyl]-6-methyl-4H-pyren-4-ylidene]methyl]-3-ethylbenzothiazolium perchlorate.

The wavelength sensitizer contained in the second photosensitive component of the M-capsules 5 may preferably be a dye having a maximum absorption wavelength at about 630 nm, specifically including 3-ethyl-2-[3-(1-ethyl-4(1H)-quinolinylidene)-1-propenyl]benzothiazolium iodide, 4-[5-[3-carboxy-5-hydroxy-1-(4-sulfophenyl)-1H-pyrazol-4-yl]-2,4-pentadienylidene]-4,5-dihydro-5-oxo-1-(4-sulfophenyl)-1H-pyrazole-3-carboxylic acid, and 3-ethyl-2-[3-(1-ethyl-4(1H)-quinolinylidene)-1-propenyl]benzothiazolium iodide.

The wavelength sensitizer contained in the third photosensitive component of the C-capsules 6 may preferably be a dye having a maximum absorption wavelength at about 700 nm, specifically including 1-ethyl-4-[3-(1-ethyl-4(1H)-quinolinylidene)-1-propenyl]quinolium iodide, and 1-ethyl-2-[5-(1-ethyl-2(1H)-quinolinylidene)-1,3-pentadienyl]quinolium iodide.

The wavelength sensitizer in each photosensitive component may preferably be contained in an amount of from 0.01% by weight to 5% by weight, and more preferably from 0.05% by weight to 1% by weight, based on the weight of the photopolymerizable materials.

The photopolymerization initiator may include aromatic carbonyl compounds, acetophenones, organic peroxides, diphenylhalonium salts, organic halides, 2,4,6-substituted-S-triazines, 2,4,5-triallylimidazole dimers, azo compounds, dye borate complexes, metal arene complexes and titanocene compounds, any of which may be used.

It may preferably include benzophenone, benzyl, xanthone, thioxanthone, anthraquinone, acetophenone, 2,2-dimethyl-2-morpholino-4'-methylthioacetophenone, benzoyl peroxide, 3,3',4,4'-tetrakis(t-butyldioxycarbonyl)benzophenone, diphenyliodonium bromide, diphenyliodonium chloride, carbon tetrachloride, carbon tetrabromide, 2,4,6-tristrichloromethyl-S-triazine, and ($\eta^5$-2,4-cyclopentadien-1-yl)[(1,2,3,4,5,6-$\eta$)-(1-methylethyl)benzene]iron(1+)hexafluorophosphate(1–). These photopolymerization initiators may each be used alone or in the form of a mixture of two or more.

The photopolymerization initiator may preferably be contained in an amount of from 0.1 to 10% by weight, more preferably from 1 to 10% by weight, based on the weight of the polymerizable material. If it is in an amount less than 1% by weight, in particular, less than 0.1% by weight, the photopolymerization reaction may take place with difficulty. Even if it is used in excess, i.e., in an amount more than 10% by weight, in particular, more than 20% by weight, the sensitivity is no longer improved.

The polymerizable material may include unsaturated compounds, e.g., compounds having ethylenically unsaturated groups and compounds having epoxy groups. The compounds having ethylenically unsaturated groups are particularly preferred, as having a relatively higher photopolymerization rate. The compounds having ethylenically unsaturated groups may include acrylic acid and salts thereof, acrylates, acrylamides, methacrylic acid and salts thereof, methacrylates, methacrylamides, maleic anhydrides, maleates, itaconates, styrenes, vinyl ethers, vinyl esters, N-vinyl heterocyclic rings, allyl ethers, allyl esters, and derivatives of these. Acrylates or methacrylates are more preferred.

As examples of the acrylates, they may include butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecanedimethylol diacrylate, tripropylene glycol diacrylate, bisphenol-A diacrylate, pentaerythritol triacrylate, dipentaerythritol hexaacrylate, dipentaerythritol caprolactone adduct hexaacrylate, trimethylolpropane triacrylate, trimethylolpropane propylene oxide adduct triacrylate, polyoxyethylated bisphenol-A diacrylatpolyurethane acrylate, and polyurethane acrylate.

As examples of the methacrylates, they may include butyl methacrylate, cyclohexyl methacrylate, ethylhexyl methacrylate, benzyl methacrylate, furfuryl methacrylate, ethoxyethyl methacrylate, tricyclodecanyloxy methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecanedimethylol dimethacrylate, tripropylene glycol dimethacrylate, bisphenol-A dimethacrylate, pentaerythritol trimethacrylate, dipentaerythritol hexamethacrylate, dipentaerythritol caprolactone adduct hexamethacrylate, trimethylolpropane trimethacrylate, trimethylolpropane propylene oxide adduct trimethacrylate, polyoxyethylated bisphenol-A dimethacrylate, polyester methacrylate, and polyurethane methacrylate. These polymerizable materials may each be used alone or in the form of a mixture of two or more.

It is particularly preferred that at least one of pentaerythritol triacrylate, dipentaerythritol hexaacrylate, dipentaerythritol caprolactone adduct hexaacrylate, trimethylolpropane triacrylate, and trimethylolpropane propylene oxide adduct triacrylate is contained, which have at least three unsaturated groups acrylonitrile groups in the molecule.

In the individual microcapsules, the image-forming agent and the photosensitive component are mixed with each other.

The image-forming agent may be constituted of a dye or pigment which is colored in itself. Use of the photosensitive recording medium having such an image-forming agent makes it possible to record images also on what is called plain paper, which is coated with no developing agent, used as the image-receiving sheet. Such a dye or pigment may be selected as those having suitable tinges, from among commercially available dyes and pigments and also those described in books such as dye handbooks and pigment handbooks and in publications.

The dye or pigment may particularly preferably include, as yellow dyes or pigments, monoazo and disazo dyes or pigments, azo calcium lakes and azo barium lakes; as magenta dyes or pigments, quinacridones and calcium lakes; and as cyan dyes or pigments, phthalocyanines. When any of these dyes and pigments are added, its concentration must be controlled so as not to inhibit the action of the wavelength sensitizer.

The dye or pigment may preferably be contained in an amount of from 0.1% by weight to 10% by weight, more preferably 0.5% by weight to 5% by weight, based on the weight of the photopolymerizable materials.

A dye precursor may also be used as the image-forming agent. As examples of such a dye precursor, it may include diphenylmethane compounds, triphenylmethane compounds, bisphenylmethane compounds, xanthene compounds, thiazine compounds, fluorane compounds, spiropyrane compounds, acetanilide compounds, pyrazolone compounds, and mixtures of these, any of which may be used.

In the case when the dye precursor is used as the image-forming agent and when the color developer as will be described later is not contained in the photosensitive layer, the image-receiving sheet on which color images are to be finally formed must be coated with a developer capable of reacting with the dye precursor to cause it to form a color. As the developer, an electron-attractive colorless compound is commonly used, which chiefly includes phenolic resins, zinc salts of salicylic acid derivatives, and acidic clay.

The precursor may preferably be contained in an amount of from 0.1% by weight to 10% by weight, more preferably 0.5% by weight to 5% by weight, based on the weight of the photopolymerizable materials.

The microcapsules can be prepared by methods having been used as known techniques in the present industrial field. For example, such methods include, but not limited to, the method of phase separation from an aqueous solution as disclosed in U.S. Pat. No. 2,800,457 and U.S. Pat. No. 2,800,458, the interfacial polymerization method as disclosed in Japanese Patent Publications No. 38-19574, No. 42-446 and No. 42-771, the in-situ method carried out by polymerization of monomers as disclosed in Japanese Patent Publication No. 36-9168 and Japanese Patent Application Laid-open No. 51-9079, and the melt-dispersion cooling method as disclosed in British Patents No. 952,807 and No. 965,074.

Materials used to form shells of the microcapsules may be either inorganic substances or organic substances so long as the shells (walls) can be formed by the above capsule preparation methods. Materials that can well transmit light are preferred.

As examples, such materials may include gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine-formaldehyde resin, urea-formaldehyde resin, and copolymers of any of these.

Melamine-formaldehyde resin and urea-formaldehyde resin are particularly preferred, which can be produced by a relatively simple process because they are produced by an in-situ method in which materials for the walls are fed only in water. When the microcapsules are prepared in this way, a composition used as a material to be encapsulated must be dispersed or emulsified in an aqueous medium. In such an instance, the aqueous medium may preferably contain a nonionic or ionic water-soluble polymer.

As the nonionic water-soluble polymer, it may include polyvinyl alcohol, polyvinyl pyrrolidone, polyacrylamide, polymethyl vinyl ether, hydroxymethyl cellulose, and hydroxyethyl cellulose. As the ionic water-soluble polymer, it may include polystyrene sulfinic acid, polystyrene sulfonate, a styrene-sulfonic acid copolymer, polyvinyl sulfate, polyvinyl sulfonate, maleic anhydride, styrene copolymers, and a maleic anhydride-isobutylene copolymer.

The microcapsules may preferably have a particle size (diameter) as small as possible because the resolution of images is improved, but such capsules can be prepared with difficulty, resulting in a high cost. On the other hand, the larger the particle size is, the lower the resolution of images is. Accordingly, they may have a particle size of from 0.001 to 0.03 mm, and preferably from 0.005 to 0.02 mm. Also, needless to say, the less scattering the particle size has, the more preferable images can be obtained.

Materials used in the base material 2 of the photosensitive recording medium 1 according to the first embodiment of the present invention may include papers such as plain paper, woodfree paper and coated paper; films of resins such as polyester, polyethylene, polypropylene, acetyl cellulose, cellulose ester, polyvinyl acetal, polystyrene, polycarbonate, polyethylene terephthalate, and polyimide; and synthetic papers comprised of papers and resins. In particular, films of polyethylene terephthalate or the like are preferred because they have superior plane smoothness, strength and so forth, and also have a thickness of as small as 0.05 mm and can have a relatively small volume when brought into a roll. Any of these films on at least one side of which a reflective layer is formed by aluminum vacuum deposition are particularly preferred because of an effect of improving the photosensitivity of the photosensitive recording medium. The base material may be used either in the form of a rolled sheet or in the form of a cut sheet.

To form the photosensitive layer by coating a microcapsule composition on the base material described above, a microcapsule dispersion may be used in which a hydrophilic binder resin is mixed. The hydrophilic binder resin may include natural materials such as gelatin, cellulose, starch and gum arabic, and synthetic polymeric materials such as polyvinyl alcohol, polyvinyl pyrrolidone, polyacrylic acid, polymethacrylic acid, polyacrylamide, polyvinyl imidazole and polystyrene sulfonic acid, any of which may be used.

A second embodiment of the present invention will be described below with reference to FIG. 3.

Figure 3:
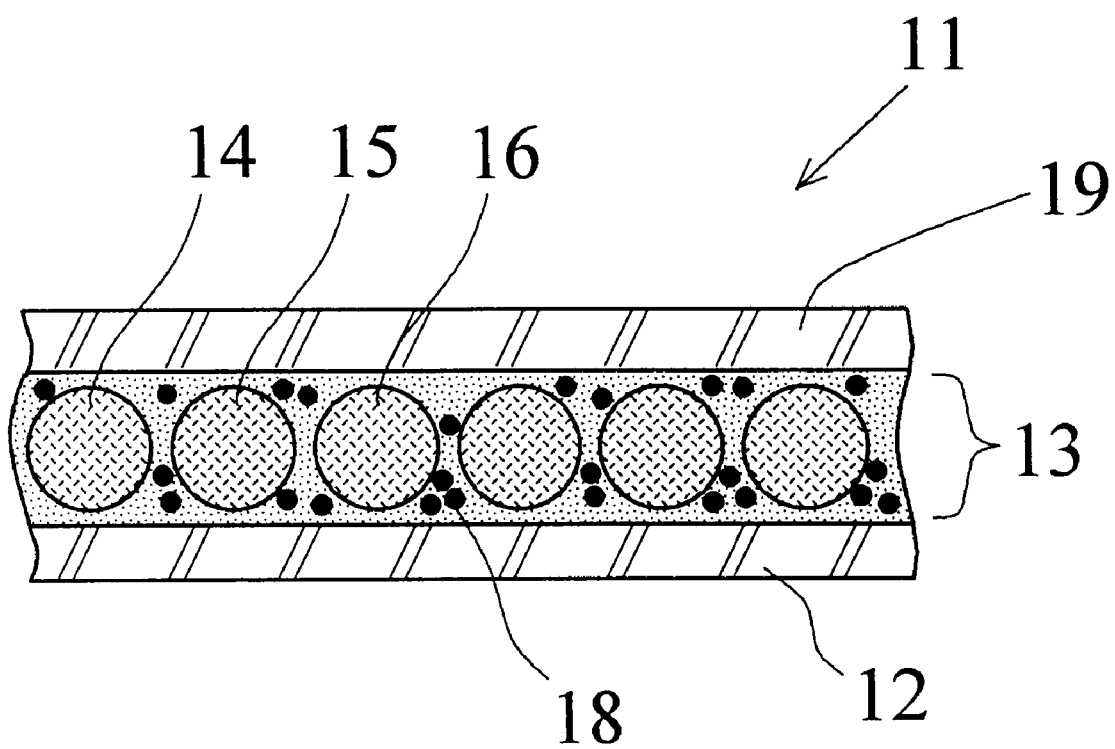
FIG. 3 is a cross section diagrammatically showing a photosensitive recording medium according to a second embodiment of the present invention.

FIG. 3 is a cross section diagrammatically showing a photosensitive recording medium according to the second embodiment. In this second embodiment, a dye precursor is used as the image-forming agent and a color developer is incorporated into the photosensitive layer.

A photosensitive recording medium 11 comprises a base material 12 formed of a transparent or opaque film and coated on its surface a photosensitive color-forming layer 13 that is photosensitive to visible light to harden and is capable of forming a color. A transparent cover film (a transparent layer) 19 is also provided on the side opposite to the base material 12, of the photosensitive color-forming layer 13.

Stated more specifically, the photosensitive color-forming layer 13 is formed by mixture of three different microcapsules comprised of yellow color-forming photosensitive microcapsules (hereinafter "Y-capsules") 14, magenta color-forming photosensitive microcapsules (hereinafter "M-capsules") 15 and cyan color-forming photosensitive microcapsules (hereinafter "C-capsules") 16, a developer 18 and a binder resin.

In such a photosensitive recording medium 11, after it has been exposed to light in accordance with image information, dye precursors inside the microcapsules having not hardened are released as a result of pressing or the like, whereupon the dye precursors react with the developer (color developer) contained in the photosensitive color-forming layer and the dye precursors form colors. More specifically, a full-color image is formed in the photosensitive color-forming layer 13 of the photosensitive recording medium 11. Since this image is viewed by, e.g., a user through the cover film, an image look glossy can be obtained. Since also this image is held between the base material 12 and the cover film 19 in a laminate form, the image can be prevented from coming off and have good water resistance and rub resistance. It can also be prevented from fading.

The Y-capsules 14 comprise a shell formed of resin, and enclosed in the shell the first photosensitive component having a maximum hardening sensitivity to light with wavelength L1 and its vicinity and a yellow color-forming dye precursor. The M-capsules 15 comprise a shell formed of resin, and enclosed in the shell the second photosensitive component having a maximum hardening sensitivity to light with wavelength L2 and its vicinity and a magenta color-forming dye precursor. The C-capsules 16 comprise a shell formed of resin, and enclosed in the shell the third photosensitive component having a maximum hardening sensitivity to light with wavelength L3 and its vicinity and a cyan color-forming dye precursor. The developer (color developer) 18 of the photosensitive color-forming layer 13 reacts with the dye precursors to cause them form colors. As the developer (color developer), an electron-attractive colorless compound is commonly used, which chiefly includes phenolic resins, zinc salts of salicylic acid derivatives, and acidic clay.

The wavelengths L1, L2 and L3 giving the maximum hardening sensitivities of the above photosensitive components are, stated specifically, 505 nm for L1, 585 nm for L2 and 665 nm for L1. These wavelengths correspond to the central wavelengths of light emitted from green, orange and red fluorescent display tubes, respectively. Needless to say, these may also be constituted so as to correspond to those of LEDs.

As in the case of the first embodiment, the respective photosensitive components each comprise a polymerizable material, a photopolymerization initiator and a wavelength sensitizer.

As the wavelength sensitizer contained in the first photosensitive component of the Y-capsules 14, 3-ethyl-2-[2-[(3-ethyl-5-phenyl-2(3H)-benzoxyazolylidene)methyl]-1-butenyl]-5-phenylbenzoxazolium iodide or 5-phenyl-2-[2-[[5-phenyl-3-(3-sulfopropyl)-2(3H)-benzoxyazolylidene) methyl]-1-butenyl]-3-(3-sulfopropyl)benzoxazolium hydroxide salt may be used.

As the wavelength sensitizer contained in the second photosensitive component of the M-capsules 15, 1-ethyl-4-[(1-ethyl-4(1H)-quinolinylidene)methyl]quinolinium iodide, 3-ethyl-2-[3[(3-ethylnaphtho[2,1-d]thiazol-2(3H)-ylidene-1-propenyl]naphtho[2,1-d]thiazolium iodide or the like may be used.

As the wavelength sensitizer contained in the third photosensitive component of the C-capsules 16, 3-ethyl-2-[5-(3-ethyl-2(3H)-benzoselenazolylidene)-1,3-pentadienyl] benzoselenazolium iodide, 3-ethyl-5-[3-ethyl-5-[2-(3-ethyl-4(1H)-quinolinylidiene)ethylidene]-4-oxo-2-thiazolidinylidene]-2-thioxo-4-thiazolidinone, 3-ethyl-2-[[3-ethyl-5-[2-(1-ethyl-4(1H)-quinolinylidiene)ethylidene]-4-oxo-2-thiazolidinylidene]methyl]benzoxazolium iodide or the like may be used.

The microcapsules according to the second embodiment are different from the microcapsules according to the first embodiment only in the photosensitive wavelengths, and have the like basic composition of microcapsules. Thus, with regard to other constituents, the microcapsules may have the same constitution as the microcapsules according to the first embodiment.

The photosensitive recording medium of the present invention can be produced by coating on the base material a photosensitive layer forming composition prepared by uniformly dispersing the yellow color-forming particles containing the first photosensitive component having a maximum hardening sensitivity to light with wavelength L1, the magenta color-forming particles containing the second photosensitive component having a maximum hardening sensitivity to light with wavelength L2 and the cyan color-forming particles containing the third photosensitive component having a maximum hardening sensitivity to light with wavelength L3, together with the binder resin, solvent and optionally other additive components (e.g., the color developer), followed by drying, and optionally further followed by lamination of a film that forms the transparent layer.

As is clear from what has been described above, according to the photosensitive recording medium of the present invention, all the wavelengths giving the maximum hardening sensitivities of the photosensitive components respectively contained in the yellow color-forming particles, the magenta color-forming particles and the cyan color-forming particles are set at wavelengths longer than 500 nm. Hence, commercially available inexpensive light sources such as LEDs (light-emitting diodes), fluorescent display tubes, plasma display devices, electroluminescence display devices or the like can be used as the exposure light sources without any wavelength conversion.

When the color-forming particles are in the form of microcapsules comprised of the shell formed of a resin and, contained inside the shell, the photosensitive component and image-forming agent, the shell formed of a resin restrains the photosensitive component in the shell and the oxygen in the atmosphere from mixing. This makes the photosensitive component efficiently undergo photopolymerization, and hence images can be recorded by exposure using a smaller energy.

When the colorless dye precursor capable of forming a color upon reaction with a color developer is used as the image-forming agent contained in the color-forming particles, the color developer is contained in the photosensitive layer. Thus, the photosensitive recording medium before exposure has a colorless photosensitive layer, and color images are directly formed in the photosensitive layer upon exposure followed by pressure development. Hence, what is consumed for the formation of images is only the photosensitive recording medium, and only one sort of supplies may be used, compared with those in which a color developer is coated on an image-receiving sheet and the photosensitive surface of the photosensitive recording medium and the developer-coated surface of the image-receiving sheet are put into face-to-face contact, followed by pressure development to form full-color images on the image-receiving sheet, and those in which copying sheets and toner are consumed as in the case of electrophotographic copying machines. Thus, the image-forming apparatus can be made to have a very simple constitution and also can be made small-sized and more inexpensive.

When the transparent layer is further formed so as to cover the photosensitive layer, the transparent layer protects the color images formed and hence the color images can be prevented from damaging or fading.

EXAMPLES

The present invention will be described below in greater detail by giving Examples. The present invention is by no means limited to these Examples, and can also be worked under appropriate modification of the materials used, the weight proportions thereof and the preparation conditions within the purport of what has been previously described.

Example 1

The present Example is an example of the photosensitive recording medium according to the first embodiment, shown in FIG. 1.

First, yellow image-recording photosensitive microcapsules containing a yellow pigment and having a maximum hardening sensitivity at about 565 nm was prepared in the following way.

Dipentaerythritol hexaacrylate and phenol acrylate were weighed out in a weight ratio of 3:1 and mixed by means of a stirrer to obtain an acrylic material. To this acrylic material, an azo barium lake pigment was added using polyurethane as a dispersant, followed by mixing, and thereafter the mixture was kneaded 10 passes by means of a three-roll mill to prepare a mill base with the pigment dispersed therein.

The mill base thus prepared was made to have an appropriate pigment concentration by adding the acrylic material, followed by addition of a wavelength sensitizer 1-ethyl-2-[(1-ethyl-4(1H)-quinolinylidene)methyl]quinolinium iodide and a photopolymerization initiator ($\eta^5$-2,4-cyclopentadien-1-yl) [(1,2,3,4,5,6-$\eta$)-(1-methylethyl)benzene]iron(1+) hexafluorophosphate(1−), which were dissolved by heating at 100° C. for 10 minutes to obtain a material to be encapsulated in yellow image-forming microcapsules.

Composition of the material to be encapsulated is shown below.

| | |
|---|---|
| Acrylic material (polymerizable compound) | 100 g |
| Pigment | 2 g |
| Photopolymerization initiator | 2 g |
| Wavelength sensitizer | 0.05 g |

Next, into 200 ml of an emulsifier 1:1 aqueous solution mixture of an aqueous solution of 5% of partial sodium salt of polystyrene sulfonic acid and an aqueous solution of 5% of styrene-maleic anhydride copolymer, the material having the above composition was added, followed by stirring at 6,000 r.p.m. for 5 minutes by means of a homogenizer to obtain what is called an O/W emulsion, in which the liquid component was present in the aqueous solution in the form of droplets.

Separately from the above, commercially available melamine powder was added to an aqueous 37% formaldehyde solution, and the pH of the mixture obtained was adjusted to 9.0 using a sodium hydroxide solution, followed by heating at a water temperature of 60° C. for 30 minutes to obtain a melamine-formaldehyde prepolymer.

The melamine-formaldehyde prepolymer was added to the O/W emulsion previously prepared, and the mixture obtained was heated so as to have a water temperature of 70° C. while stirring at 100 to 300 r.p.m. by means of an agitating homomixer. This state of heating was maintained for 3 hours, and thereafter the pH of the mixture was adjusted to 7, followed by cooling to room temperature. Thus, yellow image-forming microcapsules in which the material having the above composition was encapsulated and whose shells were formed of melamine-formaldehyde resin were obtained by the in-situ method.

To measure the photosensitivity, a photohardening composition was coated on a transparent PET film in a thickness of 10 μm, and its surface was further covered with a like PET film as an oxygen barrier. The sample obtained was set in a spectral sentitometer (manufactured by Narumi Shokai) to measure the sensitivity of the photohardening composition.

Next, magenta image-recording photosensitive microcapsules containing a magenta pigment and having a maximum hardening sensitivity at about 630 nm were prepared in the following way.

The procedure for preparing the yellow image-recording photosensitive microcapsules was repeated to prepare magenta image-recording photosensitive microcapsules, except that the azo barium lake pigment was replaced with a quinacridone pigment and 3-ethyl-2-[3-(1-ethyl-4(1H)-quinolinylidene)-1-propenyl]benzothiazolium iodide was used as the wavelength sensitizer.

Cyan image-recording photosensitive microcapsules containing a cyan pigment and having a maximum hardening sensitivity at about 700 nm were also prepared in the following way.

The procedure for preparing the yellow image-recording photosensitive microcapsules was repeated to prepare cyan image-recording photosensitive microcapsules, except that the azo barium lake pigment was replaced with a phthalocyanine pigment and 1-ethyl-4-[3-(1-ethyl-4(1H)-quinolinylidene)-1-propenyl]quinolium iodide was used as the wavelength sensitizer.

The yellow, magenta and cyan microcapsules prepared in this way were mixed in an amount of 3 parts, 2 parts and 3 parts by weight, respectively, and as a binder 4 parts by weight of an aqueous 5% polyvinyl alcohol solution was further mixed to prepare a capsule coating solution. Using a multi-coater manufactured by Hirano Tekushido K.K., the capsule coating solution was coated on a 38 μm thick PET (polyethylene terephthalate) film. After the photosensitive layer thus formed was dried, its thickness was measured to find that it was 18 μm.

The photosensitive recording medium produced in this way was successively exposed to light using LEDs (green: 565 nm; orange: 630 nm; red: 700 nm; exposure conditions: green (50 μW, 1.5 sec); orange (80 μW, 1.5 sec); red (90 μW, 1.5 sec)), whereupon a sharp color image was obtained.

Example 2

The present Example is an example of the photosensitive recording medium according to the second embodiment, shown in FIG. 3.

First, yellow image-recording photosensitive microcapsules containing a yellow color-forming dye precursor and having a maximum hardening sensitivity at about 505 nm was prepared in the following way.

Dipentaerythritol hexaacrylate and phenol acrylate were weighed out in a weight ratio of 3:1 and mixed by means of a stirrer to obtain an acrylic material. To this acrylic material, a dye precursor React Yellow (available from BASF Corp.), a wavelength sensitizer 5-phenyl-2-[2-[[5-phenyl-3-(3-sulfopropyl)-2(3H)-benzoxyazolylidene)methyl]-1-butenyl]-3-(3-sulfopropyl)benzoxazolium hydroxide salt and a photopolymerization initiator (η$^5$-2,4-cyclopentadien-1-yl) [(1,2,3,4,5,6-η)-(1-methylethyl) benzene]iron(1+) hexafluorophosphate(1−) were added, and dissolved by heating at 100° C. for 10 minutes to obtain a material to be encapsulated in yellow image-forming microcapsules.

Composition of the material to be encapsulated is shown below.

| Acrylic material (polymerizable compound) | 100 g |
|---|---|
| Dye precursor | 0.1 g |
| Photopolymerization initiator | 2 g |
| Wavelength sensitizer | 0.05 g |

Next, into 200 ml of an emulsifier 1:1 aqueous solution mixture of an aqueous solution of 5% of partial sodium salt of polystyrene sulfonic acid and an aqueous solution of 5% of styrene-maleic anhydride copolymer, the material having the above composition was added, followed by stirring at 6,000 r.p.m. for 5 minutes by means of a homogenizer to obtain what is called an O/W emulsion, in which the liquid component was present in the aqueous solution in the form of droplets.

Separately from the above, commercially available melamine powder was added to an aqueous 37% formaldehyde solution, and the pH of the mixture obtained was adjusted to 9.0 using a sodium hydroxide solution, followed by heating at a water temperature of 60° C. for 30 minutes to obtain a melamine-formaldehyde prepolymer.

The melamine-formaldehyde prepolymer was added to the O/W emulsion previously prepared, and the mixture obtained was heated so as to have a water temperature of 70° C. while stirring at 100 to 300 r.p.m. by means of an agitating homomixer. This state of heating was maintained for 3 hours, and thereafter the pH of the mixture was adjusted to 7, followed by cooling to room temperature. Thus, yellow image-forming microcapsules in which the material having the above composition was encapsulated and whose shells were formed of melamine-formaldehyde resin were obtained by the in-situ method.

Next, magenta image-recording photosensitive microcapsules containing a magenta color-forming dye precursor and having a maximum hardening sensitivity at about 585 nm were prepared in the following way.

The procedure for preparing the yellow image-recording photosensitive microcapsules was repeated to prepare magenta image-recording photosensitive microcapsules, except that HD-5100 (available from Hilton-Davis Chemical Co.) was used as the dye precursor and 1-ethyl-4-[(1-ethyl-4(1H)-quinolinylidene)methyl]quinolinium iodide was used as the wavelength sensitizer.

Cyan image-recording photosensitive microcapsules containing a cyan color-forming dye precursor and having a maximum hardening sensitivity at about 665 nm were also prepared in the following way.

The procedure for preparing the yellow image-recording photosensitive microcapsules was repeated to prepare cyan image-recording photosensitive microcapsules, except that CP-177 (available from Hilton-Davis Chemical Co.) was used as the dye precursor and 3-ethyl-5-[3-ethyl-5-[2-(3-ethyl-4(1H)-quinolinylidiene)ethylidene]-4-oxo-2-thiazolidinylidene]-2-thioxo-4-thiazolidinone was used as the wavelength sensitizer.

The yellow, magenta and cyan microcapsules prepared in this way were mixed in the same manner as in Example 1, and the mixture was dispersed in a binder aqueous 5% polyvinyl alcohol solution. To 100 g of the mixture obtained, 70 g of a color developer zinc salicylate was further mixed to prepare a coating solution. This coating solution was coated on a 50 μm thick PET film by means of a test coater. To the surface of the photosensitive layer thus formed, a 38

μm thick PET film was further laminated, thus a photosensitive recording medium was obtained.

This photosensitive recording medium was successively exposed to light in accordance with image information, using fluorescent display tubes (bluish green: 505 nm; yellow: 585 nm; red: 665 nm; exposure conditions: bluish green (300 μW, 1 sec); yellow (90 μW, 4 sec); red (60 μW, 5 sec)). Immediately after the image formation, the image had a little insufficient density, and hence the photosensitive recording medium with such an image was passed through a heat-fixing roller having a surface temperature of 120° C. As a result, a sharp color image with a high density was obtained.

The entire disclosure of the Japanese Patent application NO. 8-86284 filed on Apr. 9, 1996 including specification, claims and summary is incorporated herein by reference in its entirety.

What is claimed is:

1. A photosensitive recording medium comprising a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3; all the wavelengths L1, L2 and L3 being wavelengths longer than 500 nm;

said color-forming particles being microcapsules;

said photosensitive components each comprising a polymerizable material, a photopolymerization initiator and a wavelength sensitizer; and the wavelength sensitizer contained in the first photosensitive component being at least one of 1-ethyl-2-[(1-ethyl-4(1H)-quinolinylidene)methyl]quinolinium iodide, 2-[[2-[4-(dimethylamino)phenyl]ethynyl]-6-methyl-4H-pyren-4-ylidene]methyl]-3-ethylbenzothiazolium perchlorate, 3-ethyl-2-[2-[(3-ethyl-5-phenyl-2(3H)-benzoxyazolylidene)methyl]-1-butenyl]-5-phenylbenzoxazolium iodide and 5-phenyl-2-]2-[[5-phenyl-3-(3-sulfopropyl)-2(3H)-benzoxyazolylidene)methyl]-1-butenyl]-3-(3-sulfopropyl)benzoxazolium hydroxide salt.

2. The photosensitive recording medium according to claim 1, wherein said wavelengths L1, L2 and L3 satisfy the following expression (1):

$$L1<L2<L3 \tag{1}$$

3. The photosensitive recording medium according to claim 1, wherein each microcapsule comprises a shell and enclosed therein the corresponding photosensitive component and an image-forming agent.

4. The photosensitive recording medium according to claim 3, wherein said shell is constituted of at least one of gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine-formaldehyde resin, urea-formaldehyde resin, and a copolymer of any of these.

5. The photosensitive recording medium according to claim 3, wherein said shell is constituted of melamine-formaldehyde resin or urea-formaldehyde resin.

6. The photosensitive recording medium according to claim 3, wherein said microcapsules have a particle diameter of from 0.001 to 0.03 mm.

7. The photosensitive recording medium according to claim 1, wherein said wavelength sensitizer is contained in an amount of from 0.01% by weight to 5% by weight based on the weight of the photopolymerizable material.

8. The photosensitive recording medium according to claim 1, wherein said photopolymerization initiator is at least one of an aromatic carbonyl compound, an acetophenone, an organic peroxide, a diphenylhalonium salt, an organic halide, a 2,4,6-substituted-S-triazine, a 2,4,5-triallylimidazole dimer, an azo compound, a dye borate complex, a metal arene complex and a titanocene compound.

9. The photosensitive recording medium according to claim 1, wherein said photopolymerization initiator is at least one of benzophenone, benzil, xanthone, thioxanthone, anthraquinone, acetophenone, 2,2-dimethyl-2-morpholino-4-methylthioacetophenone, benzoyl peroxide, 3,3',4,4'-tetrakis(t-butyldioxycarbonyl)benzophenone, diphenyliodonium bromide, diphenyliodonium chloride, carbon tetrachloride, carbon tetrabromide, 2,4,6-tristrichloromethyl-S-triazine and ($\eta^5$-2,4-cyclopentadien-1-yl)[(1,2,3,4,5,6-$\eta$)-(1 -methylethyl)benzene]iron hexafluorophosphate.

10. The photosensitive recording medium according to claim 1, wherein said photopolymerization initiator is contained in an amount of from 0.1% by weight to 20% by weight based on the weight of the polymerizable material.

11. The photosensitive recording medium according to claim 1, wherein said photopolymerization initiator is contained in an amount of from 1% by weight to 10% by weight based on the weight of the polymerizable material.

12. The photosensitive recording medium according to claim 1, wherein said polymerizable material is a compound having an ethylenically unsaturated group or a compound having an epoxy group.

13. The photosensitive recording medium according to claim 12, wherein said compound having an ethylenically unsaturated group is at least one of acrylic acid or a salt thereof, an acrylate, an acrylamide, methacrylic acid or a salt thereof, a methacrylate, a methacrylamide, maleic anhydride, a maleate, an itaconate, a styrene, a vinyl ether, a vinyl ester, an N-vinyl heterocyclic ring, an allyl ether and, an allyl ester.

14. The photosensitive recording medium according to claim 12, wherein said compound having an ethylenically unsaturated group is an acrylate or a methacylate.

15. The photosensitive recording medium according to claim 14, wherein said acrylate is at least one of butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecanedimethylol diacrylate, tripropylene glycol diacrylate, bisphenol-A diacrylate, pentaerythritol triacrylate, dipentaerythritol hexaacrylate, dipentaerythritol caprolactone adduct hexaacrylate, trimethylolpropane triacrylate, trimethylolpropane propylene oxide adduct triacrylate, polyoxyethylated bisphenol-A diacrylate, polyester acrylate and polyurethane acrylate.

16. The photosensitive recording medium according to claim 14, wherein said methacrylate is at least one of butyl methacrylate, cyclohexyl methacrylate, ethylhexyl methacrylate, benzyl methacrylate, furfuryl methacrylate, ethoxylethyl methacrylate, tricyclodecanyloxy methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecanedimethylol dimethacrylate, tripropylene glycol dimethacrylate, bisphenol-A dimethacrylate, pentaerythritol trimethacrylate, dipentaerythritol hexamethacrylate, dipentaerythritol caprolactone adduct hexamethacrylate, trimethylolpropane trimethacrylate, trimethylolpropane propylene oxide adduct trimethacrylate, polyoxyethylated bisphenol-A dimethacrylate, polyester methacrylate and polyurethane methacrylate.

17. The photosensitive recording medium according to claim 1, wherein said polymerizable material is at least one of pentaerythritol triacrylate, dipentaerythritol hexaacrylate, dipentaerythritol caprolactone adduct hexaacrylate, trimethylolpropane triacrylate, and trimethylolpropane propylene oxide adduct triacrylate.

18. The photosensitive recording medium according to claim 1, wherein said image-forming agent is a colorless dye precursor capable of forming a color upon reaction with a color developer.

19. The photosensitive recording medium according to claim 18, wherein said dye precursor is at least one of a diphenylmethane compound, a triphenylmethane compound, a bisphenylmethane compound, a xanthene compound, a thiazine compound, a fluorane compound, a spiropyrane compound, an acetanilide compound, a pyrazolone compound, and a mixture of any of these.

20. The photosensitive recording medium according to claim 18, wherein said color developer is an electron-attractive colorless compound.

21. The photosensitive recording medium according to claim 20, wherein said electron-attractive colorless compound is a phenolic resin, a zinc salt of a salicylic acid or acidic clay.

22. The photosensitive recording medium according to claim 18, wherein said color developer is contained in the photosensitive layer.

23. The photosensitive recording medium according to claim 1, wherein said photosensitive layer has a structure in which the respective color-forming particles are dispersed in a hydrophilic binder.

24. The photosensitive recording medium according to claim 23, wherein said hydrophilic binder is at least one of gelatin, cellulose, starch, gum arabic, polyvinyl alcohol, polyvinyl pyrrolidone, polyacrylic acid, polymethacrylic acid, polyacrylamide, polyvinyl imidazole and polystyrene sulfonic acid.

25. The photosensitive recording medium according to claim 1, which further comprises a transparent layer formed so as to cover said photosensitive layer.

26. The photosensitive recording medium according to claim 25, wherein said transparent layer is a polyethylene terephthalate film.

27. The photosensitive recording medium according to claim 1, wherein the image information lights are emitted from fluorescent display tubes or light emitting diodes.

28. The photosensitive recording medium according to claim 1, wherein said image-forming agent is a dye or pigment which is colored in itself.

29. A photosensitive recording medium comprising a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3; all the wavelengths L1, L2 and L3 being wavelengths longer than 500 mn;

said color-forming particles being microcapsules;

said photosensitive components each comprising a polymerizable material, a photopolymerization initiator and a wavelength sensitizer; and the wavelength sensitizer contained in the second photosensitive component being at least one of 3-ethyl-2-[3-(1-ethyl-4(1 H)-quinolinylidene)-1-propenyl] benzothiazolium iodide, 4-[5-[3-carboxy-5-hydroxy-1-(4-sulfophenyl)-1H-pyrazol-4-yl]-2,4-pentadene]-4,5-dihydro-5-oxo-1-(4-sulfophenyl)-1H-pyrazole-3-carboxylic acid and 3-ethyl-2-[3-(1ethyl-4(1H)-quinolinylidene)-1-propenyl]benzothiazolium iodide, 1-ethyl-4-[(1-ethyl-4(1H)-quinolinylidene)methyl] quinolinium iodide and 3-ethyl-2-[3[(3-ethylnaphtho [2,1-d]thiazol-2(3H)-ylidene-1-propenyl]naphtho[2,1-d]thiazolium iodide.

30. A photosensitive recording medium comprising a base material and formed thereon a photosensitive layer containing at least yellow color-forming particles containing a first photosensitive component having a maximum hardening sensitivity to light with wavelength L1, magenta color-forming particles containing a second photosensitive component having a maximum hardening sensitivity to light with wavelength L2 and cyan color-forming particles containing a third photosensitive component having a maximum hardening sensitivity to light with wavelength L3; all the wavelengths L1, L2 and L3 being wavelengths longer than 500 nm;

said color-forming particles being microcapsules;

said photosensitive components each comprising a polymerizable material, a photopolymerization initiator and a wavelength sensitizer; and the wavelength sensitizer contained in the third photosensitive component being at least one of 1-ethyl-4-[3-(1-ethyl-4(1H)-quinolinylidene)-1-propenyl]quinolium iodide, 1-ethyl-2-[5-(1-ethyl-2(1H)-quinolinylidene)-1,3-pentadienyl]quinolium iodide, 3-ethyl-5-(3-ethyl-2 (3H)-benzoselenazolylidene)-1,3-pentadienyl] benzoselenazolium iodide, 3-ethyl-5-[3-ethyl-5-[2-(1-ethyl-4(1H)-quinolinylidiene)ethylidene]-4-oxo-2-thiazolidinylidene]-2-thioxo-4-thiazolidinone and 3-ethyl-2-[[3-ethyl-5-[2-(3-ethyl-4(1H)-quinolinylidiene)ethylidene]-4-oxo-2-thiazolidinylidene]methyl]benzoxazolium iodide.

* * * * *